United States Patent [19]

Rodder et al.

[11] Patent Number: 5,079,180

[45] Date of Patent: Jan. 7, 1992

[54] METHOD OF FABRICATING A RAISED SOURCE/DRAIN TRANSISTOR

[75] Inventors: Mark S. Rodder; Richard A. Chapman, both of Dallas, Tex.

[73] Assignee: Texas Instruments Incorporated, Dallas, Tex.

[21] Appl. No.: 568,305

[22] Filed: Aug. 16, 1990

Related U.S. Application Data

[62] Division of Ser. No. 289,346, Dec. 22, 1988, Pat. No. 4,998,150.

[51] Int. Cl.$^5$ ............................................ H01L 21/336
[52] U.S. Cl. ................................. 437/44; 437/41; 437/162
[58] Field of Search .................... 437/27, 34, 40, 41, 437/44, 43, 56, 57, 162, 160, 186, 193, 200, 203, 233; 357/23.3, 59 G, 59 I, 41

[56] References Cited

U.S. PATENT DOCUMENTS

| | | | |
|---|---|---|---|
| 4,359,816 | 11/1982 | Abbas et al. | 437/44 |
| 4,378,627 | 4/1983 | Jambotkar | 437/56 |
| 4,463,491 | 8/1984 | Goldman et al. | 437/162 |
| 4,471,522 | 9/1984 | Jambotkar | 437/162 |
| 4,485,046 | 7/1989 | Shimbo | 437/44 |
| 4,546,535 | 10/1985 | Shepard | 357/23.12 |
| 4,677,736 | 7/1987 | Brown | 437/41 |
| 4,688,314 | 8/1987 | Weinberg et al. | 437/162 |
| 4,707,456 | 11/1987 | Thomas et al. | 437/34 |
| 4,713,356 | 12/1987 | Hiruta | 437/41 |
| 4,735,916 | 4/1988 | Homma et al. | 437/162 |
| 4,745,086 | 5/1988 | Parrillo et al. | 437/44 |
| 4,764,481 | 8/1988 | Alvi et al. | 437/56 |
| 4,778,774 | 10/1988 | Blossfeld | 437/162 |
| 4,780,429 | 10/1988 | Roche et al. | 437/41 |
| 4,788,160 | 11/1988 | Havemann et al. | 437/200 |
| 4,822,754 | 4/1989 | Lynch et al. | 437/200 |
| 4,826,782 | 5/1989 | Sachitano et al. | 437/41 |
| 4,844,776 | 7/1989 | Lee et al. | 437/43 |
| 4,868,137 | 9/1989 | Kubota | 437/43 |
| 4,874,713 | 10/1989 | Gioia | 437/200 |
| 4,888,297 | 12/1989 | Aboelfotoh et al. | 437/162 |
| 4,939,154 | 7/1990 | Shimbo | 437/193 |
| 4,945,070 | 7/1990 | Hsu | 437/162 |
| 4,948,743 | 8/1990 | Ozaki | 437/41 |
| 4,948,745 | 8/1990 | Pfiester et al. | 437/44 |
| 4,965,219 | 10/1990 | Cerofolini | 437/41 |

FOREIGN PATENT DOCUMENTS

| | | | |
|---|---|---|---|
| 0121580 | 10/1978 | Japan | 437/162 |
| 0196573 | 12/1982 | Japan | 437/162 |
| 0148367 | 8/1984 | Japan | 437/162 |
| 0082456 | 4/1986 | Japan | 437/56 |
| 0147774 | 7/1987 | Japan | 437/162 |

*Primary Examiner*—Olik Chaudhuri
*Assistant Examiner*—M. Wilczewski
*Attorney, Agent, or Firm*—Melvin Sharp; James T. Comfort; N. Rhys Merrett

[57] ABSTRACT

A raised source/drain transistor is provided having thin sidewall spacing insulators (54) adjacent the transistor gate (48). A first sidewall spacer (64) is disposed adjacent thin sidewall spacing insulator (54) and raised source/drain region (60). A second sidewall spacer (66) is formed at the interface between field insulating region (44) and raised source/drain region (60).

16 Claims, 1 Drawing Sheet

METHOD OF FABRICATING A RAISED SOURCE/DRAIN TRANSISTOR

This is a division of application Ser. No. 289,346, filed Dec. 22, 1988, now U.S. Pat. No. 4,998,150.

TECHNICAL FIELD OF THE INVENTION

This invention pertains to transistor fabrication, and more particularly to a MOSFET with raised source/drain regions and the process of fabrication thereof.

BACKGROUND OF THE INVENTION

Under current MOSFET transistor technology, raised source/drain regions are used in order to provide a transistor having ultra-shallow junctions. The raised source/drain region gives rise to numerous problems. A facet is normally formed at the interface where the raised source/drain region abuts with the insulating field oxide of the transistor structure. Additionally, a facet is normally formed at the interface where the raised source/drain region abuts with the sidewall spacing insulator adjacent the transistor gate. Subsequent silicide processes may create a spike at the location of either facet, and the spike may penetrate into the underlying semiconductor substrate and through the shallow junction. This spike may therefore short-circuit the source/drain to the silicon substrate.

In the construction of raised source/drain transistors, it is important to control diffusion associated with dopants used to create the shallow junctions of the transistor. Typically, a first implant stage is performed prior to the deposition of the raised source/drain region in order to form an electrical connection underneath a thick sidewall spacing insulator, thereby coupling the moat to the channel region. However, the subsequent step of depositing the raised source/drain region may cause the previously disposed dopant to further diffuse to such an extent that the operating characteristics of the device are changed.

Another problem associated with current raised source/drain transistors may occur during the formation of silicided contact areas. If the gate and source/drain regions are not properly isolated from one another, the silicided process applied thereto may create a conductive short-circuit between the gate and either the source or drain. Further, the unintended formation of a silicide between gate and source/drain may make it difficult to subsequently etch the silicided region in order to isolate the gate from either the source or drain.

Therefore, a need has arisen for a raised source/drain transistor which eliminates problems associated with spike formation, uncontrollable movement of dopants, and difficulties in electrically isolating the gate from the source/drain regions.

SUMMARY OF THE INVENTION

In accordance with the present invention, a new and improved source/drain transistor process is provided which substantially reduces or eliminates the disadvantages and problems associated with prior transistors having raised moat regions.

Included within the present invention is a transistor having a gate insulator over a semiconductor surface and between opposing moat insulating regions. A gate is formed over the gate insulator. An initial thin sidewall spacing insulator is formed adjacent the sidewall of the gate. The thickness of the initial sidewall spacing insulator is thin enough to permit dopants implanted after the formation of the raised source/drain to move laterally within the substrate to electrically connect the source/drain to the transistor channel, while maintaining shallow transistor junctions. The transistor includes a raised moat (source/drain) region disposed along the moat area between the gate sidewall insulator and the field insulating regions. Typically, the raised moat region is composed of epitaxial silicon. Additionally, the thickness of the initial sidewall spacing insulator is sufficient to prevent epitaxial silicon growth on the gate sidewalls during formation of the raised moat regions.

With the present invention, there is also included a first sidewall spacer disposed adjacent the gate sidewall insulator and further adjacent the raised moat region. Further, a second sidewall spacer may be formed adjacent the raised moat region and the field insulating region. More particularly, both sidewall spacers within the present invention may comprise an insulating oxide.

Important aspects of the present invention include the formation of a raised source/drain transistor which accommodates controlled doping of ultra-shallow junctions subsequent to the deposition of the raised moat regions. The use of a thin sidewall insulator permits the formation of an electrical connection between source/drain and gate channel either prior to, or after the formation of the source/drain region. In comparison to prior processes, this aspect of the present invention prevents uncontrolled movement of previously implanted dopants during the process of depositing the raised source/drain region.

In addition, another important technical advantage of the invention is the use of a sidewall spacer adjacent the gate insulator and the raised source/drain region. This spacer effectively lengthens the distance between the gate and source/drain regions. As a result, the subsequent formation of isolated silicided regions above the gate and source/drain may be better controlled. Further, the greater distance provided between the gate and source/drain region may prevent a short-circuit from occurring due to silicide formation therebetween. Another technical advantage associated with this sidewall spacer exists in that the facet underlying the spacer is no longer exposed during silicidation. As a result, the possibility of a silicide spike forming through the facet and into the semiconductor substrate is reduced.

Another technical advantage of the present invention involves the use of a sidewall spacer adjacent both the field insulating region and the raised source/drain region. This spacer may prevent the formation of a silicide spike which otherwise may form during the siliciding process. As a result, there is a lesser possibility that the silicide formed over the source/drain region may penetrate into the semiconductor substrate.

BRIEF DESCRIPTION OF THE DRAWINGS

For a more complete understanding of the present invention and for further advantages thereof, reference is now made to the following Detailed Description, taken in conjunction with the accompanying drawings, in which.

DETAILED DESCRIPTION OF THE INVENTION

Figure 1:
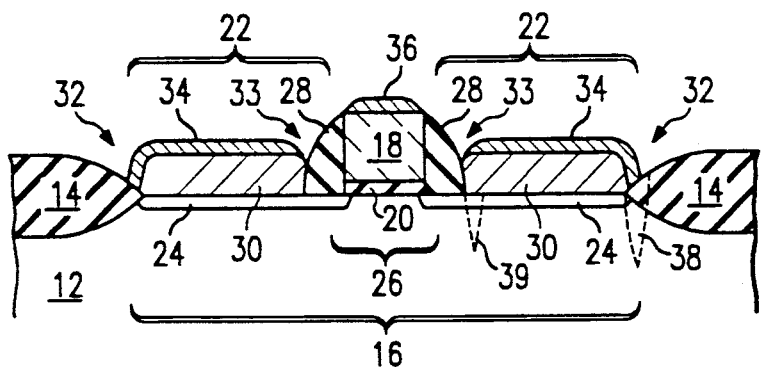
FIG. 1 illustrates a cross-sectional elevational view of a prior art raised source/drain transistor.

FIG. 1 illustrates a cross-sectional elevational view of a prior art raised source/drain transistor indicated generally at 10. Transistor 10 is formed over semiconductor substrate 12. Field insulating regions 14 are formed on substrate 12 thereby defining a moat 16 therebetween. A gate 18 is formed in moat 16 and separated from semiconductor substrate 12 by a gate insulator 20. Formation of gate 18 defines interim areas 22 for the formation of source/drain regions. An initial implantation step is used to form ultra-shallow junctions 24 which electrically connect the source/drain regions to the channel region 26 underlying gate 18.

A sidewall insulator 28 is formed adjacent the sides of gate 18. Sidewall insulator 28 typically comprises an oxide and is on the order of 1000-3000 angstroms in thickness. Raised source/drain regions 30 are then formed in the remainder of interim areas 22 and along the exposed surface of semiconductor substrate 12. Raised source/drain regions 30 typically comprise an epitaxial layer. Formation of source/drain regions 30 includes a high temperature process which may further cause dopants associated with ultra-shallow junctions 24 to move both vertically and laterally within semiconductor substrate 12. This diffusion of dopants may be undesirable. Formation of source/drain regions 30 creates void areas or facets 32 and 33. Facet 32 is defined at the interface between source/drain region 30 and field insulating region 14, while facet 33 is defined at the interface between sidewall insulator 28 and raised source/drain region 30.

Silicided regions 34 and 36 are formed over raised source/drain regions 30 and gate 18, respectively. Due to facets 32 and 33 created at the respective underlying interfaces, silicided region 34 may penetrate therethrough, thereby forming spikes 38 and 39 (shown in phantom) which extend into semiconductor substrate 12. As a result, spikes 38 and 39 may short-circuit the raised source/drain region 30 with substrate 12, thereby destroying the operability of transistor 10.

Figure 2A:
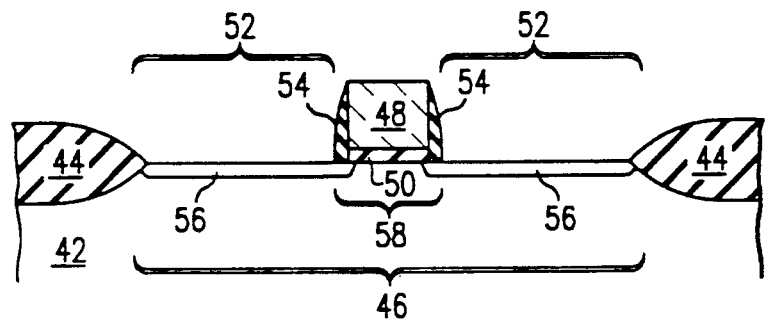
FIG. 2A illustrates a cross-sectional elevational view of the raised source/drain transistor of the present invention.

FIG. 2A illustrates a cross-sectional elevational view of the raised source/drain transistor 40 of the present invention. Transistor 40 is formed integral with semiconductor substrate 42. Insulating regions 44 are formed on semiconductor substrate 42, thereby defining a moat region 46 therebetween. A gate 48 is formed over semiconductor substrate 42 and separated therefrom by a gate insulator 50. Gate 48 is commonly made of polysilicon. Formation of gate 48 defines interim areas 52 within moat region 46 between field insulating regions 44 and gate 48.

Both field insulating regions 44 and gate insulator 50 typically comprise oxides. Gate insulator 50 may be on the order of 50-250 angstroms in height. An additional oxide layer of approximately 500-1000 angstroms may be formed overlying gate 48 in order to prevent lateral growth of gate 48 during subsequent processing steps. However, in the ideal circumstance that gate 48 will not grow laterally, then there is no need to include an oxide layer thereover.

Initial thin sidewall spacing insulators 54 are formed adjacent the sidewalls of gate 48. Typically, initial thin sidewall spacing insulators 54 comprise an oxide and are on the order of 200-900 angstroms in thickness. Ultra-shallow junctions 56 may then be implanted within semiconductor substrate 42 in the interim areas 52. Junctions 56 are formed by implanting either N-type (e.g. arsenic, phosphorus or antimony) or P-type (e.g. boron) material in a surface concentration from $5(10)^{17}/cm^3$ to $1(10)^{20}/cm^3$. It is to be noted that initial thin sidewall spacing insulators 54 are formed of a thickness sufficiently thin in order to permit dopants associated with junctions 56 to move laterally far enough to provide an electrical connection between interim areas 52 and the transistor channel region 58, while minimizing the depth of shallow junctions 56. This aspect of the present invention is important in that the existence of shallow junctions is fundamental to the benefits associated with raised source/drain transistors. Thus, these benefits are preserved while permitting electrical connection from source/drain to channel either prior to, or after, the formation of source/drain regions 60 (see FIG. 2B). Additionally, the thickness of initial thin sidewall spacing insulator 54 is sufficient to prevent formation of silicon growth on the sides of gate 48 during the formation of raised source/drain regions 60 (see FIG. 2B).

Figure 2B:
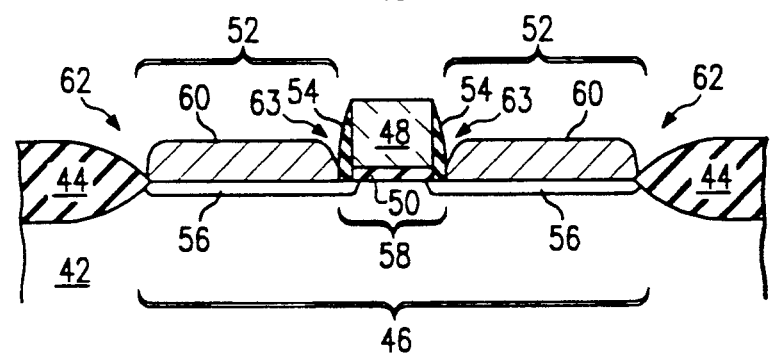
FIG. 2B illustrates the raised source/drain transistor of FIG. 2A having raised source/drain regions and initial thin sidewall spacing insulators.

FIG. 2B illustrates a cross-sectional elevational view of raised source/drain transistor 40 of the present invention after further processing steps. Raised source/drain regions 60 are formed generally within interim areas 52 at the surface of semiconductor substrate 42. Raised source/drain regions 60 may be formed by utilizing selective deposition of epitaxial silicon in a layer ranging from 1000-2000 angstroms in thickness. Again, facets 62 and 63 are defined as void areas existing at certain interfaces. Facet 62 exists between field insulating region 44 and raised source/drain regions 60, while facet 63 exists at the interface between raised source/drain regions 60 and initial thin sidewall spacing insulator 54.

It is to be noted that shallow junctions 56 may alternatively be formed after the formation of raised source/drain regions 60 as opposed to prior thereto as discussed in reference to FIG. 2A. Initial thin sidewall spacing insulators 54 have been formed of a thickness such that an implantation following the formation of raised source/drain regions 60 will still permit lateral movement of dopants sufficient to electrically connect raised source/drain regions 60 to transistor channel region 58. Thus, an important advantage of the present invention is the flexibility in forming shallow junctions 56 either prior to or after the formation of raised source/drain regions 60, while permitting adequate electrical connection to the transistor channel region 58 in either instance.

Figure 2C:
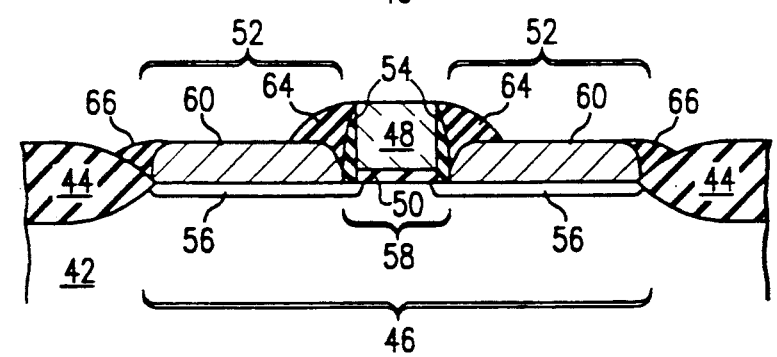
FIG. 2C illustrates the raised source/drain transistor of FIG. 2A having a first and second sidewall spacer.

FIG. 2C illustrates a cross-sectional elevational view of raised source/drain transistor 40 of the present invention having additional spacers added thereto. A first sidewall spacer 64 is formed adjacent each initial thin sidewall spacing insulator 54 and a corresponding raised source/drain region 60. A second sidewall spacer 66 is formed in the preexisting facet 62 (see FIG. 2B) between field insulating region 44 and raised source/drain region 60. Both spacers 64 and 66 may be formed at the same time by depositing an insulating layer of approximately 1000-2000 angstroms over the entire transistor 40 and then etching the insulating layer in order to form first and second sidewall spacers 64 and 66.

Figure 2D:
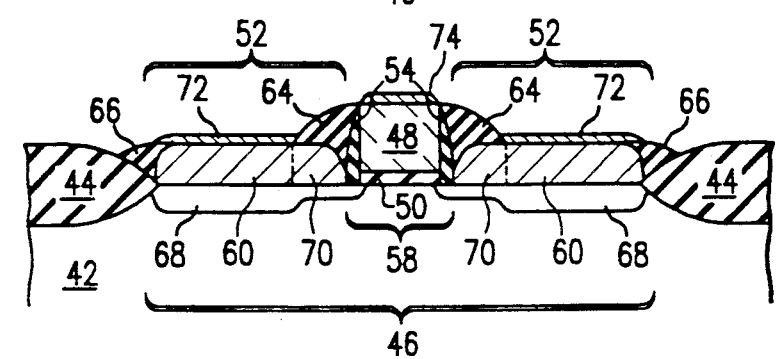
FIG. 2D illustrates the raised source/drain transistor of FIG. 2A having silicided contact areas and a region of different dopant concentration within the raised source/drain regions.

FIG. 2D illustrates a cross-sectional elevational view of raised source/drain transistor 40 of the present invention following a second implantation stage and the addition of silicided regions. Following the formation of first and second sidewall spacers 64 and 66, a second implantation may be performed. This second implantation will form shallow junctions 68 and further dope raised source/drain regions 60. Shallow junctions 68 may be deeper than ultra shallow junctions 56 (see FIG. 2A). Due to the added thickness of first sidewall spacer 64, the implantation will be partially blocked from the underlying area 70 within raised source/drain regions 60. Thus, underlying area 70 may be of a dopant concentration different than the remainder of raised source/drain region 60.

Low resistance silicided regions 72 and 74 are formed over raised source/drain regions 60 and gate 48, respectively. The formation of silicided regions 72 and 74 may be effected by placing a layer of titanium over the entire structure and then reacting the same in a nitrogen ambient. Silicon from raised source/drain regions 60 will react with the titanium layer thereby forming titanium silicide ($TiSi_2$) over the exposed silicon regions. However, where there is no underlying silicon, the titanium will only react with the nitrogen ambient, thereby forming titanium nitride (TiN) over nonsilicon surfaces including field insulating region 44 and spacers 66 and 64. As a result, the TiN segments may be selectively removed, thereby leaving low resistance silicided regions 72 and 74 as areas of electrical contact for transistor 40.

It may now be appreciated that first sidewall spacer 64 effectively lengthens the distance between raised source/drain region 60 and the contacting top surface of gate 48. The increased distance between raised source/drain region 60 and gate 48 provides two primary benefits. First, the added thickness of insulating material provided by first spacer 64 prevents the sidewall of gate 48 from reacting with the titanium layer during the process of forming silicides. Second, by lengthening the distance between raised source/drain regions 60 and gate 48, there is a reduced chance of silicide forming therebetween and thus a lesser chance of a short-circuit between the two. Further, the formation of a silicide between gate 48 and a source/drain region 60 will provide etching difficulties in attempting to remove this flawed connection while not interfering with the remainder of the device. Thus, the increased distance from source/drain region 60 to gate 48 ameliorates this potential difficulty. First sidewall spacer 64 also prevents silicide formation within facet 63 (see FIG. 2B). As a result, the chance of a spike 39 (see FIG. 1) is effectively reduced.

The addition of second sidewall spacer 66 prevents silicide formation within facet 62 (see FIG. 2B). As a result, the chance of a spike 38 (see FIG. 1) associated with the prior art is effectively reduced, thereby further insuring device operability.

The present invention provides a raised source/drain transistor which effectively reduces problems associated with prior like devices. An initial thin sidewall spacing insulator is provided such that implantation of dopants for connecting raised source/drain regions to the transistor channel may be performed either prior to or after the deposition of selective epitaxial silicon. Further, the gate sidewalls are protected from silicon growth during the formation of raised source/drain regions. The addition of a first sidewall spacer increases the thickness of insulator between the raised source/drain region and the gate. As a result, the sidewalls of the gate may be prevented from reacting with silicides formed over exposed silicon areas of the transistor. There is also a decreased possibility of a short-circuit forming between the gate and a raised source/drain region. A second sidewall spacer provided at the interface between the raised source/drain and the field insulating region may prevent the possibility of a silicide spike penetrating the interface and interfering with device operability. Likewise, the first sidewall spacer may prevent a silicide spike from forming through the interface between the initial thin sidewall spacing insulator and the raised source/drain region.

Although the present invention has been described in detail, it should be understood that various changes, substitutions and alterations can be made herein without departing from the spirit and scope of the invention as defined by the appended claims.

What is claimed is:

1. A method of forming a transistor structure associated with a semiconductor substrate, comprising:
    forming first and second insulating regions disposed outwardly from said substrate to define a moat area therebetween;
    forming a gate disposed outwardly from said moat area, said gate including sidewalls and defining a channel region in the substrate thereunder;
    forming a sidewall insulator adjacent said sidewalls of said gate;
    forming a raised moat region disposed along said moat and between said sidewall insulator and said first insulating region; and
    forming an insulating first sidewall spacer disposed adjacent said sidewall insulator and said raised moat region with at least a portion of said first sidewall spacer disposed between said gate and said raised moat region.

2. The method of claim 1 and further including forming a region within said raised moat region and adjacent said first sidewall spacer, said region being of a different dopant concentration than the remainder of said moat region.

3. The method of claim 1 wherein said step of forming the sidewall insulator comprises forming a thin sidewall insulator, said thin sidewall insulator of a thickness such that dopants implanted through said raised moat region may move laterally within said substrate to electrically connect said raised moat region to said channel region, while maintaining shallow junctions within said substrate.

4. The method of claim 3 wherein said step of forming said thin sidewall insulator comprises forming the thin sidewall insulator of a thickness less than nine hundred angstroms.

5. The method of claim 1 wherein said step of forming the raised moat region comprises forming epitaxial silicon.

6. The method of claim 1 wherein said step of forming the first sidewall spacer comprises forming an insulator.

7. The method of claim 1 and further including forming a junction region prior to said step of forming said raised moat region.

8. The method of claim 1 and further including forming a junction region after said step of forming said raised moat region.

9. A method of forming a transistor structure associated with a semiconductor substrate, comprising:
- forming first and second insulating regions disposed outwardly from said substrate to define a moat area therebetween;
- forming a gate disposed outwardly from said moat area, said gate including sidewalls and defining a channel region in the substrate thereunder;
- forming a sidewall insulator adjacent said sidewalls of said gate;
- forming a raised moat region disposed along said moat area and between said sidewall insulator and said first insulating region; and
- forming an insulating first sidewall spacer disposed adjacent said first insulating region and said raised moat region.

10. The method of claim 9 wherein said sidewall insulator adjacent said sidewall of said gate is of a thickness such that dopants implanted through said raised moat region may move laterally within said substrate to electrically connect said raised moat region to said channel region, while maintaining shallow junctions within said substrate.

11. The method of claim 9 wherein said step of forming the thin insulator comprises forming the thin insulator of a thickness less than nine hundred angstroms.

12. The method of claim 9 forming a second sidewall spacer disposed adjacent said sidewall insulator and said raised moat region, wherein said step of forming the second sidewall spacer comprises forming an insulator.

13. The method of claim 9 and further including forming a region within said raised moat region and adjacent said first sidewall spacer, said region being of a different dopant concentration that the remainder of said moat region.

14. The method of claim 9 wherein said step of forming the raised moat region comprises forming epitaxial silicon.

15. A method of forming a transistor structure associated with a semiconductor substrate, comprising:
- forming first and second insulating regions disposed outwardly from said substrate to define a moat area therebetween;
- forming a gate disposed outwardly from said moat area, said gate including sidewalls and defining a channel region in the substrate thereunder;
- forming a sidewall insulator adjacent said sidewalls of said gate;
- forming a raised moat region disposed along said moat and between said sidewall insulator and said first insulating region;
- forming an insulating first sidewall spacer disposed adjacent said sidewall insulator and said raised moat region with at least a portion of said first sidewall spacer disposed between said gate and said raised moat region; and
- further including forming a second sidewall spacer disposed adjacent said first insulating region and said raised moat region, wherein said step of forming the second sidewall spacer comprises forming an insulator.

16. The method of claim 15 wherein:
said sidewall insulator is of a thickness such that dopants implanted through said raised moat region may move laterally within said substrate to electrically connect said raised moat region to said channel region, while maintaining shallow junctions within said substrate.

* * * * *